United States Patent
Candler et al.

(10) Patent No.: US 7,875,482 B2
(45) Date of Patent: Jan. 25, 2011

(54) SUBSTRATE WITH MULTIPLE ENCAPSULATED PRESSURES

(75) Inventors: Robert N. Candler, Los Angeles, CA (US); Gary Yama, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 119 days.

(21) Appl. No.: 12/407,639

(22) Filed: Mar. 19, 2009

(65) Prior Publication Data

US 2010/0240163 A1  Sep. 23, 2010

(51) Int. Cl.
*H01L 21/00* (2006.01)
(52) U.S. Cl. .................. 438/51; 438/55; 257/E21.499; 257/E29.324
(58) Field of Classification Search ............ 438/51, 438/55, 106, 127; 257/E21.499, E29.354
See application file for complete search history.

(56) References Cited

U.S. PATENT DOCUMENTS

| | | | |
|---|---|---|---|
| 6,146,917 A | 11/2000 | Zhang et al. | |
| 6,307,815 B1 | 10/2001 | Polosky et al. | |
| 6,352,935 B1 | 3/2002 | Collins et al. | |
| 6,426,239 B1 | 7/2002 | Gogoi et al. | |
| 6,454,160 B2 | 9/2002 | Gueissaz | |
| 6,477,901 B1 | 11/2002 | Tadigadapa et al. | |
| 6,507,082 B2 | 1/2003 | Thomas | |
| 6,718,605 B2 | 4/2004 | Yazdi et al. | |
| 6,943,448 B2 | 9/2005 | Gabriel et al. | |
| 7,004,028 B2 | 2/2006 | Park et al. | |
| 7,045,459 B2 | 5/2006 | Feidhoff | |
| 7,153,717 B2 | 12/2006 | Carley et al. | |
| 7,172,917 B2 | 2/2007 | Partridge et al. | |
| 7,288,824 B2 * | 10/2007 | Partridge et al. | ............ 257/414 |
| 7,563,633 B2 * | 7/2009 | Ulm et al. | ............ 438/51 |
| 2001/0004085 A1 | 6/2001 | Gueissaz | |

(Continued)

FOREIGN PATENT DOCUMENTS

WO  0177008  10/2001

(Continued)

OTHER PUBLICATIONS

R.N. Candler et al., Long-Term and Accelerated Life Testing of a Novel Single-Wafer Vacuum Encapsulation for MEMS Resonators, Stanford University, Departments of Electrical and Mechanical Engineering, 35 pages.

(Continued)

*Primary Examiner*—Walter L Lindsey, Jr.
(74) *Attorney, Agent, or Firm*—Maginot, Moore & Beck

(57) ABSTRACT

A method of forming a device with multiple encapsulated pressures is disclosed herein. In accordance with one embodiment of the present invention, there is provided a method of forming a device with multiple encapsulated pressures, including providing a substrate, forming a functional layer on top of a surface of the substrate, the functional layer including a first device portion at a first location, and a second device portion at a second location adjacent to the first location, encapsulating the functional layer, forming at least one diffusion resistant layer above the encapsulated functional layer at a location above the first location and not above the second location, modifying an environment adjacent the at least one diffusion resistant layer, and diffusing a gas into the second location as a result of the modified environment.

15 Claims, 4 Drawing Sheets

U.S. PATENT DOCUMENTS

| | | | |
|---|---|---|---|
| 2004/0183214 A1* | 9/2004 | Partridge et al. | 257/787 |
| 2006/0108652 A1* | 5/2006 | Partridge et al. | 257/414 |
| 2006/0246631 A1* | 11/2006 | Lutz et al. | 438/127 |
| 2007/0042521 A1 | 2/2007 | Yama | |
| 2007/0077675 A1 | 4/2007 | Diem | |
| 2007/0099327 A1 | 5/2007 | Hartzell et al. | |
| 2009/0065928 A1* | 3/2009 | Lutz et al. | 438/51 |

FOREIGN PATENT DOCUMENTS

WO     0177009     10/2001

OTHER PUBLICATIONS

Aaron Partridge et al., MEMS Resonators: Getting the Packaging Right.

* cited by examiner

SUBSTRATE WITH MULTIPLE ENCAPSULATED PRESSURES

FIELD OF THE INVENTION

This invention relates to fabrication processes for semiconductor devices.

BACKGROUND

Microelectromechanical systems (MEMS), for example, gyroscopes, resonators and accelerometers, utilize micromachining techniques (i.e., lithographic and other precision fabrication techniques) to reduce mechanical components to a scale that is generally comparable to microelectronics. MEMS typically include a mechanical structure fabricated from or on, for example, a silicon substrate using micromachining techniques.

The mechanical structures in MEMS devices are typically sealed in a chamber. The delicate mechanical structure may be sealed in, for example, a hermetically sealed metal container (for example, a TO-8 "can" as described in U.S. Pat. No. 6,307,815) or bonded to a semiconductor or glass-like substrate having a chamber to house, accommodate or cover the mechanical structure (see, for example, U.S. Pat. Nos. 6,146,917; 6,352,935; 6,477,901; and 6,507,082). In the context of the hermetically sealed metal container, the substrate on, or in which, the mechanical structure resides may be disposed in and affixed to the metal container. The hermetically sealed metal container also serves as a primary package as well.

In the context of the semiconductor or glass-like substrate packaging technique, the substrate of the mechanical structure may be bonded to another substrate whereby the bonded substrates form a chamber within which the mechanical structure resides. In this way, the operating environment of the mechanical structure may be controlled and the structure itself protected from, for example, inadvertent contact. The two bonded substrates may or may not be the primary package for the MEMS as well.

Another technique for forming the chamber that protects the delicate mechanical structure of a MEMS device employs micromachining techniques. (See, for example, International Published Patent Applications Nos. WO 01/77008 A1 and WO 01/77009 A1). In this regard, the mechanical structure is encapsulated in a chamber using a conventional oxide ($SiO_2$) deposited or formed using conventional techniques (i.e., oxidation using low temperature techniques (LTO), tetraethoxysilane (TEOS) or the like). (See, for example, WO 01/77008 A1, FIGS. 2-4). When implementing this technique, the mechanical structure is encapsulated prior to packaging and/or integration with integrated circuitry.

When the chamber in which the mechanical structure is housed is sealed, the final pressure and the gaseous environment of the chamber are determined by the temperature, pressure, and atmosphere at the time the chamber is sealed. Accordingly, when using processes, such as a seal glass bonding process, wherein all of the chambers on a wafer are exposed to the same environment at the time the chambers area sealed, each of the chambers on the wafer have the same final pressure.

What is needed is a method of forming wafers such that different final pressures are realized in different chambers on the wafer. A further need exists for such a method which does not significantly increase the cost of producing the wafer.

SUMMARY

In accordance with one embodiment of the present invention, there is provided a method of forming a device with multiple encapsulated pressures, including providing a substrate, forming a functional layer on top of a surface of the substrate, the functional layer including a first device portion at a first location, and a second device portion at a second location adjacent to the first location, encapsulating the functional layer, forming at least one diffusion resistant layer above the encapsulated functional layer at a location above the first location and not above the second location, modifying an environment adjacent the at least one diffusion resistant layer, and diffusing a gas into the second location as a result of the modified environment.

In accordance with a further embodiment, a method of forming a device with multiple encapsulated pressures includes providing a substrate, forming a functional layer on top of a surface of the substrate, forming a first chamber in the functional layer, forming a second chamber in the functional layer, sealing the first chamber, sealing the second chamber, forming a diffusion resistant layer above the sealed second chamber, and diffusing gas into the sealed first chamber.

DESCRIPTION

Figure 1:
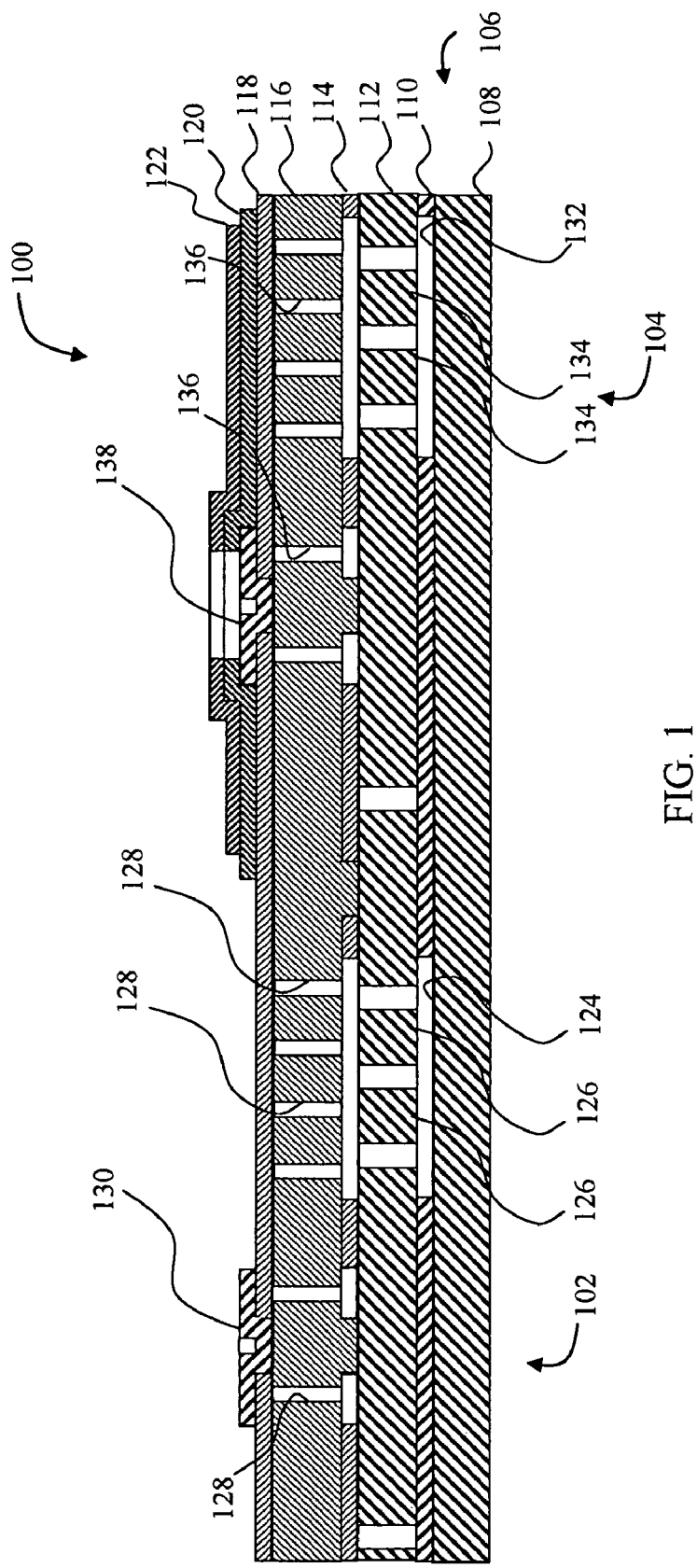
FIG. 1 depicts a side cross-sectional view of a wafer device with two functional components, with two diffusion resistant layers positioned above one of the functional components, wherein the pressure within the chambers of the two functional components are different in accordance with principles of the present invention.

For the purposes of promoting an understanding of the principles of the invention, reference will now be made to the embodiments illustrated in the drawings and described in the following written specification. It is understood that no limitation to the scope of the invention is thereby intended. It is further understood that the present invention includes any alterations and modifications to the illustrated embodiments and includes further applications of the principles of the invention as would normally occur to one skilled in the art to which this invention pertains.

FIG. 1 depicts a side cross-sectional view of a wafer device 100. The wafer device 100 includes a first functional component 102 and a second functional component 104. The functional components 102 and 104 may be of the same type (e.g., gyroscope) or of different types (e.g., one accelerometer and one gyroscope). Additional functional components of the same or different types may also be included on the wafer device 100.

The functional component 102 and the functional component 104 are formed on a substrate 106, which, in this embodiment, is a silicon on insulator (SOI) substrate. The substrate 106 includes an SOI handle layer 108, a buried oxide layer 110 and an SOI functional layer 112. A sacrificial oxide layer 114 is located above the functional layer 112 followed by an epitaxial encapsulation layer 116 and an oxide layer 118. A first diffusion resistant layer 120 is located above the functional component 104 and another diffusion resistant layer 122 is located above the diffusion resistant layer 120.

The first functional component 102 includes a chamber 124 and resonators 126, which are formed in the functional layer 112. A number of trenches 128 extend through the encapsulation layer 116 and an electrical contact 130 extends through the oxide layer 118.

The functional component 104 similarly includes a chamber 132 and resonators 134, which are formed in the functional layer 112. A number of trenches 136 extend through the encapsulation layer 116 and an electrical contact 138 extends through the oxide layer 118.

The chamber 124 in this embodiment has a pressure that is higher than the pressure in the chamber 132. Accordingly, even if the functional component 102 is otherwise identical to the functional component 104, the functional component 102 will exhibit operating characteristics different from the operating characteristics of the functional component 104. The difference in pressure is effected by the diffusion resistant layers 120 and 122 and the manufacturing process of the wafer device 100 as described below.

Figure 2:
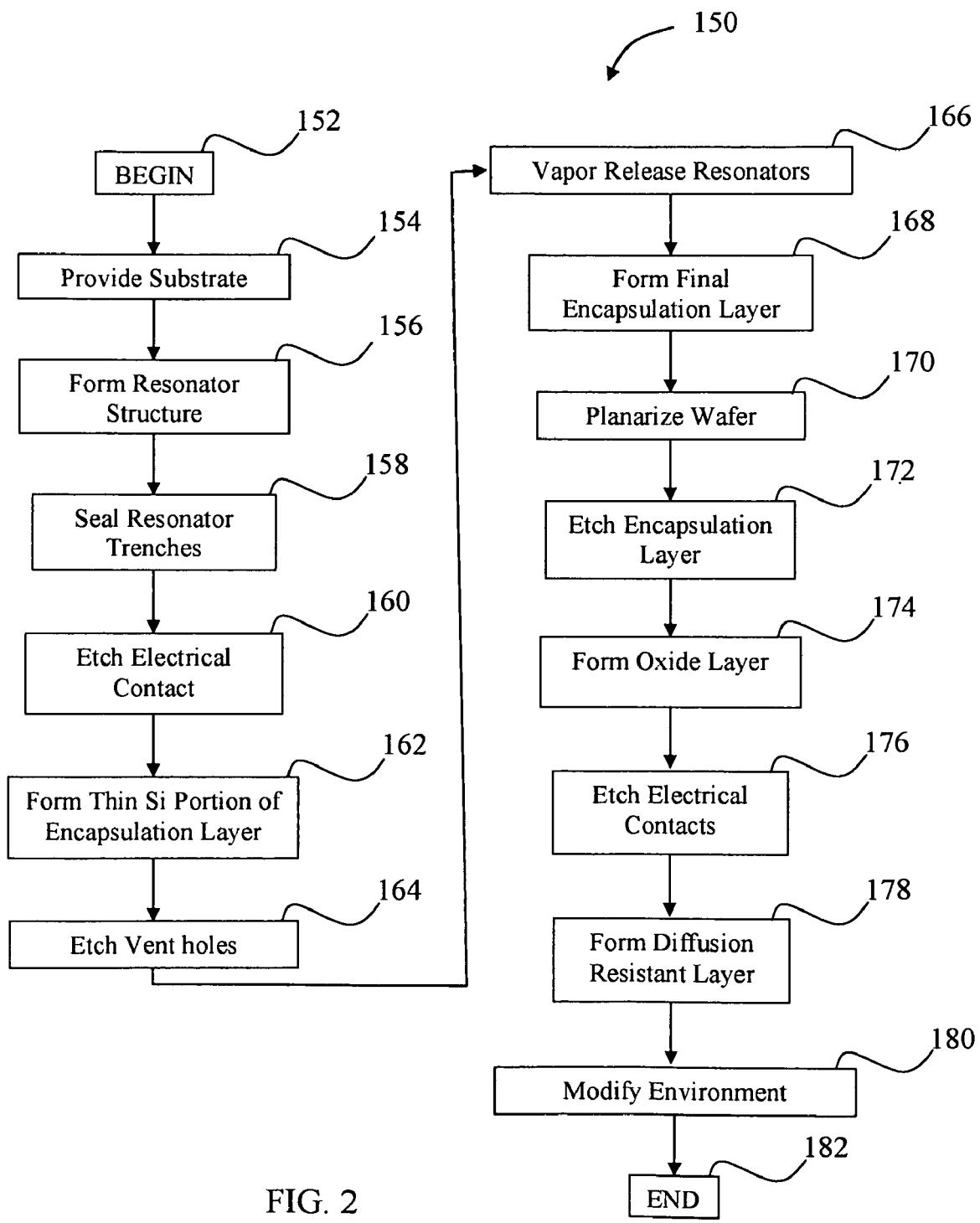
FIG. 2 depicts a flow chart of a process for manufacturing a device with chambers of different pressures in accordance with principles of the present invention.

FIG. 2 shows a flow chart 150 of a manufacturing process that may be used to produce the wafer device 100. The process 150 of FIG. 2 begins (block 152) and a substrate is provided (block 154). A photomask defining resonator structures is then used to form the resonator structures (block 156). Once formed, the resonator structures are sealed with a sacrificial oxide layer (block 158). Electrical contacts are then etched into the seal layer (block 160) and a first portion of an encapsulation layer, which in this embodiment is a thin silicon layer, is formed over the seal layer (block 162). Vent holes are etched through the thin silicon layer (block 164) and a vapor phase hydrofluoric acid (HF) is used to etch the sacrificial oxide layer to release the resonator structures (block 166).

The second portion of the encapsulation layer is formed (block 168) which closes the vents and provides structural stability, and the top surface of the encapsulation layer is planarized using chemical mechanical polishing (CMP) (block 170). The planarized surface is etched to provide trenches which define isolated pillars of silicon for electrical throughputs (block 172). An oxide layer, deposited on the wafer to close the trenches (block 174), is etched to define electrical contacts (block 176) and one or more diffusion resistant layers are formed over selected portions of the wafer (block 178). The wafer is exposed to a controlled environment (block 180) to selectively modify the pressure within the area surrounding the resonators and the process then ends (block 182).

Figure 3:
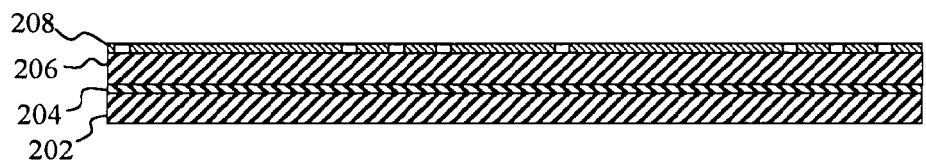
FIG. 3 depicts a cross-sectional view of a substrate, which in this embodiment is a silicon on insulator (SOI) substrate, with a photomask, which may be used in a device in accordance with principles of the present invention.
Figure 4:
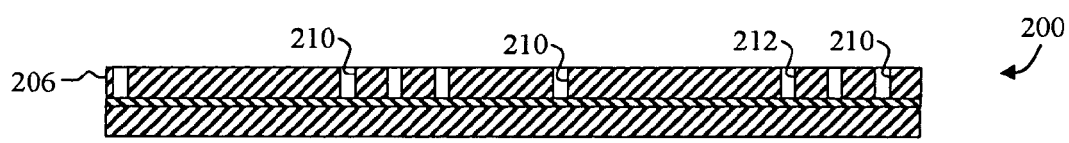
FIG. 4 depicts a cross-sectional view of the substrate of FIG. 3 with trenches formed in the functional layer of the substrate.
Figure 5:
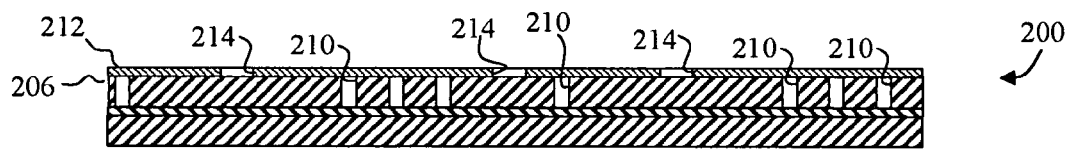
FIG. 5 depicts a cross-sectional view of the substrate of FIG. 4 with the trenches sealed with a sacrificial layer and holes for defining electrical contacts formed in the sacrificial layer.

One example of the process of FIG. 2 is shown in FIGS. 3-10. A substrate 200 is shown in FIG. 3. The substrate 200 in this embodiment is a silicon on insulator (SOI) substrate including an SOI handle layer 202, a buried silicon dioxide layer 204 and a functional SOI layer 206. A photomask 208 is formed on the exposed upper surface of the SOI active layer 206. Deep reactive ion etching (DRIE) of the substrate 200 creates trenches 210 which define unreleased resonators in the functional SOI layer 206. Next, a sacrificial layer 212 of LPCVD oxide is used to seal the trenches 210 and contact holes 214 are etched into the sacrificial layer 212 as shown in FIG. 5.

Figure 6:
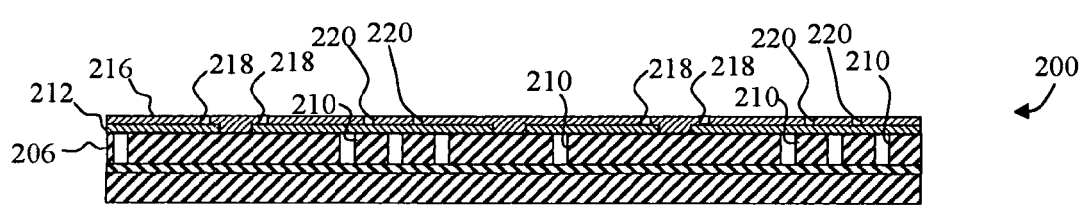
FIG. 6 depicts a cross-sectional view of the substrate of FIG. 5 with a thin portion of an encapsulating layer formed over the sacrificial layer and vent holes formed in the thin portion of the encapsulation layer.
Figure 7:
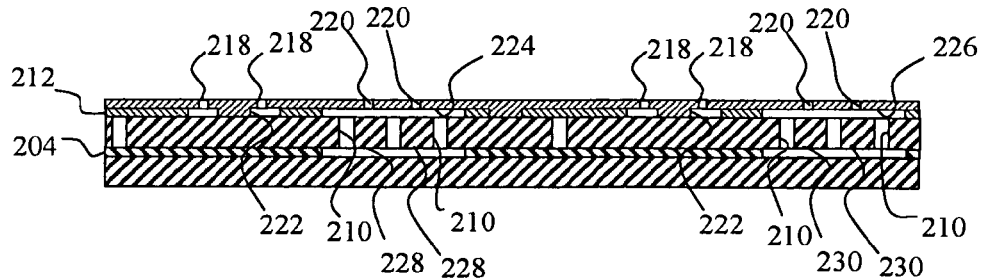
FIG. 7 depicts a cross-sectional view of the substrate of FIG. 6 after vapor etching has been used to defined electrical contacts and to release resonators for two functional components.

A first portion 216 of a silicon encapsulation layer is deposited on the sacrificial layer 212. In one embodiment, the first portion 216 is about 2 microns in depth. Vent holes 218 and vent holes 220 are etched through the first portion 216 as shown in FIG. 6. Vapor-phase HF is used to etch the sacrificial layer 212 located adjacent to the vent holes 218 and 220. Etching of the sacrificial layer 212 adjacent to the vent holes 218 defines electrical contacts 222 in the first portion 216. Etching of the sacrificial layer 212 adjacent to the vent holes 220 exposes some of the trenches 210 allowing the etch vapor to contact and etch the buried silicon dioxide layer 204, thereby forming a chamber 224 and a chamber 226 and to release resonator structures 228 and 230 as shown in FIG. 7.

Figure 8:
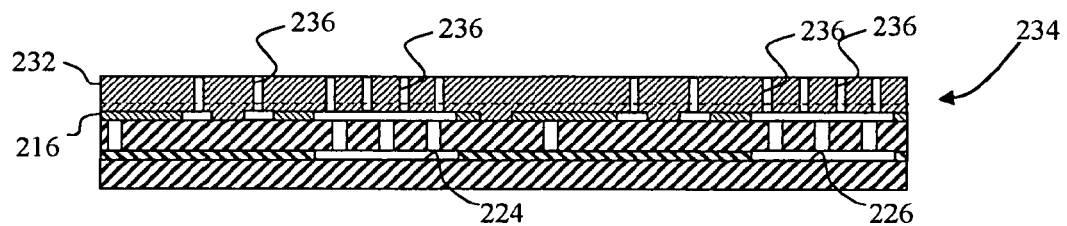
FIG. 8 depicts a cross-sectional view of the substrate of FIG. 7 after the remaining portion of the encapsulation layer has been formed and vent holes have been etched through the encapsulation layer.
Figure 9:
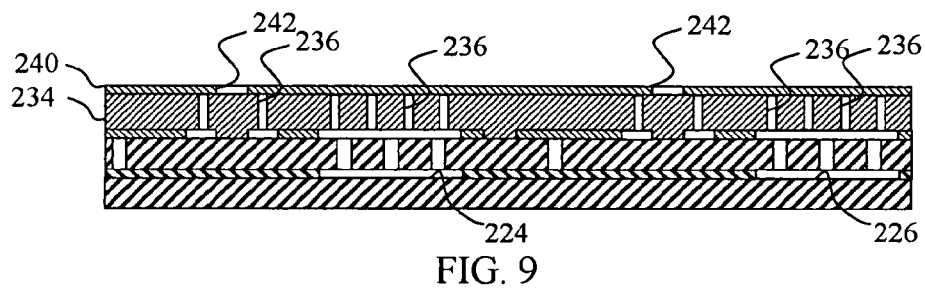
FIG. 9 depicts a cross-sectional view of the substrate of FIG. 8 with an oxide layer defining two electrical contact holes formed above the encapsulating layer.
Figure 10:
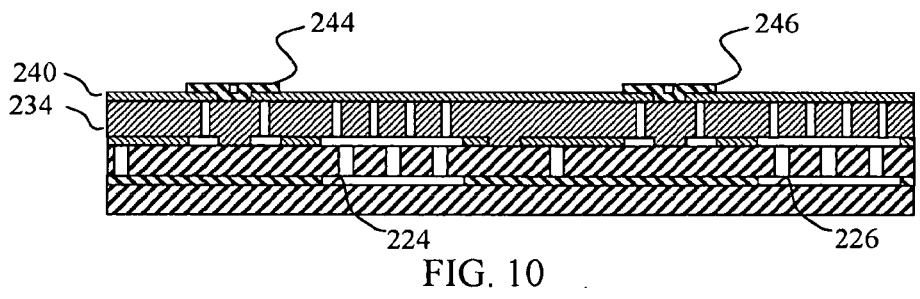
FIG. 10 depicts a cross-sectional view of the substrate of FIG. 9 with two electrical contacts formed in the electrical contact holes of the oxide layer.

A second portion 232 of the silicon encapsulation layer 234 is deposited on top of the first portion 216 and vent holes 236 are etched through the encapsulation layer 234 (see FIG. 8). The vent holes 236 expose the chambers 224 and 226 to the environment above the encapsulation layer 234. Accordingly, the environment above the encapsulation layer 234 may be modified to result in a desired pressure within the chambers 224 and 226. The vent holes 236 are then closed with an oxide layer 240 and electrical contact holes 242 are etched through the oxide layer 240 (see FIG. 9). As shown in FIG. 10, electrical contacts 244 and 246, which in one embodiment are formed from aluminum, are formed in the electrical contact holes 242.

Figure 11:
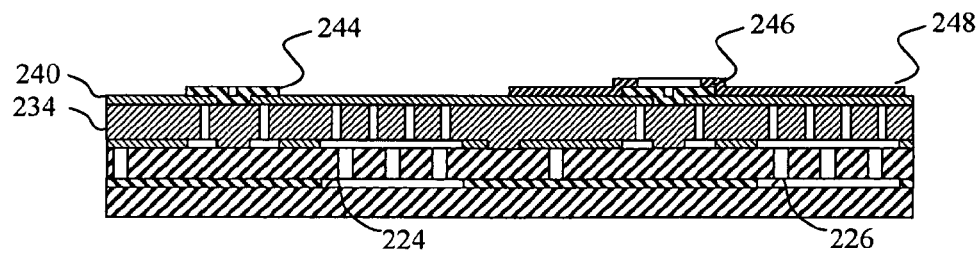
FIG. 11 depicts a side cross-sectional view of the substrate of FIG. 10 formed into a wafer device formed with two functional components, with one diffusion resistant layer positioned above one of the functional components, wherein the pressure within the chambers of the two functional components are different in accordance with principles of the present invention.

A diffusion resistant layer 248 is formed on the portion of the oxide layer 240 located above the resonators 230 (see FIG. 11). The environment above the diffusion resistant layer 248 and the oxide layer 240 is then controlled, such as by increasing the hydrogen concentration. The temperature of the diffusion resistant layer 248 and the oxide layer 240 may also be controlled, so as to generate a predetermined rate of diffusion of hydrogen through the diffusion resistant layer 248 and the oxide layer 240 and into the chambers 224 and 226.

The diffusion resistant layer 248 reduces the rate of hydrogen diffusion into the chamber 226. Accordingly, as hydrogen diffuses into the chambers 224 and 226, the pressure within the chamber 224 will increase at a rate greater than the rate of increase of pressure within the chamber 226. One method for controlling the rate of hydrogen diffusion through various materials is disclosed by Candler, et al., "Hydrogen Diffusion and Pressure Control of Encapsulated MEMS Resonators," Proceedings of Transducers, 2005, the teachings of which are hereby incorporated by reference. Thus, the final pressure within the chamber 224 is greater than the pressure within the chamber 226.

The processes and devices described above may be modified in a number of ways to provide devices for different applications including, but not limited to inertial sensing, shear stress sensing, in-plane force sensing, etc. By way of example, additional chambers may be provided on a single substrate 200. By selective deposition of one or more diffusion layers, of the same or of different materials, a variety of pressures may be realized within the different chambers.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

The invention claimed is:

1. A method of forming a device with multiple encapsulated pressures, comprising:
    providing a substrate;
    forming a functional layer on top of a surface of the substrate, the functional layer including a first device portion at a first location, and a second device portion at a second location adjacent to the first location;
    encapsulating the functional layer;
    forming at least one diffusion resistant layer above the encapsulated functional layer at a location above the first location and not above the second location;
    modifying an environment adjacent the at least one diffusion resistant layer; and
    diffusing a gas into the second location as a result of the modified environment.

2. The method of claim 1, further comprising:
    diffusing a gas into the first location as a result of the modified environment through the at least one diffusion resistant layer and the epitaxial cap layer.

3. The method of claim 2, wherein the diffusing of a gas into the first location comprises:
    diffusing the gas into the first location through trenches in the epitaxial cap layer.

4. The method of claim 1, further comprising:
    forming the functional layer including a third device portion at a third location;
    forming the at least one diffusion resistant layer with a first diffusion resistant layer at a location above the first location and the third location and not above the second location, and with a second diffusion resistant layer at a location above the first location and not above the third location or the second location; and
    diffusing the gas into the third location as a result of the modified environment.

5. The method of claim 1, wherein the first device portion comprises an accelerometer portion and the second device portion comprises a gyroscope portion.

6. The method of claim 1, wherein modifying the environment comprises:
    increasing the concentration of hydrogen within the environment; and
    increasing the temperature of the environment.

7. The method of claim 1, wherein:
    forming a functional layer includes
        forming a first chamber at the first location, and
        forming a second chamber at the second location; and
    encapsulating the functional layer includes
        sealing the first chamber with a first pressure therein, and
        sealing the second chamber with a second pressure therein, the second pressure substantially equal to the first pressure.

8. A method of forming a device with multiple encapsulated pressures, comprising:
    providing a substrate;
    forming a functional layer on top of a surface of the substrate;
    forming at least one first chamber in the functional layer;
    forming a second chamber in the functional layer;
    sealing the at least one first chamber;
    sealing the second chamber;
    forming a first diffusion resistant layer above the sealed second chamber but not above the sealed at least one first chamber; and
    diffusing gas into the sealed at least one first chamber.

9. The method of claim 8, wherein diffusing gas comprises:
    controlling the temperature of the device; and
    increasing the hydrogen concentration of an environment about the device.

10. The method of claim 8, wherein sealing the first chamber and sealing the second chamber comprises:
    forming an oxide layer on an encapsulating layer.

11. The method of claim 10, further comprising, prior to formation of the at least one first chamber:
    forming a first portion of the encapsulating layer; and
    forming vent holes through the first portion.

12. The method of claim 8, further comprising:
    forming a third chamber in the functional layer;
    sealing the third chamber;
    forming the first diffusion resistant layer above the sealed third chamber; and
    forming a second diffusion resistant layer above the sealed third chamber but not above the sealed second chamber or the sealed at least one first chamber.

13. The method of claim 12, wherein:
    the second chamber is associated with a functional component of a first type; and
    the third chamber is associated with a functional component of the first type.

14. The method of claim 8, wherein the at least one chamber comprises:
    a plurality of first chambers.

15. The method of claim 14, wherein each of the plurality of first chambers is associated with a respective one of a plurality of functional components, each of the plurality of functional components having a function different from each of the other of the plurality of functional components.

* * * * *